(12) United States Patent
Tanida et al.

(10) Patent No.: US 7,405,485 B2
(45) Date of Patent: Jul. 29, 2008

(54) SEMICONDUCTOR DEVICE

(75) Inventors: Kazumasa Tanida, Sendai (JP); Tadahiro Morifuji, Kyoto (JP); Osamu Miyata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 302 days.

(21) Appl. No.: 10/573,772

(22) PCT Filed: Jun. 9, 2005

(86) PCT No.: PCT/JP2005/010549

§ 371 (c)(1),
(2), (4) Date: Mar. 28, 2006

(87) PCT Pub. No.: WO2005/124857

PCT Pub. Date: Dec. 29, 2005

(65) Prior Publication Data

US 2006/0267186 A1    Nov. 30, 2006

(30) Foreign Application Priority Data

Jun. 16, 2004    (JP)    ............................. 2004-178756

(51) Int. Cl.
*H01L 23/48* (2006.01)
(52) U.S. Cl. .................. 257/777; 257/734; 257/773; 257/776; 257/787; 257/E23.011; 257/E23.04; 257/E23.067; 257/E23.141; 257/E23.168; 257/E23.169; 257/E23.178
(58) Field of Classification Search .................. 257/723, 257/774, 664–665, 734–786, E29.111–E29.165, 257/E23.01–E23.079, E23.141–E23.179
See application file for complete search history.

(56) References Cited

U.S. PATENT DOCUMENTS

| | | | |
|---|---|---|---|
| 6,181,002 B1 | 1/2001 | Juso et al. | |
| 6,441,500 B1 | 8/2002 | Sumikawa et al. | |
| 6,469,370 B1 | 10/2002 | Kawahara et al. | |
| 6,680,529 B2 * | 1/2004 | Chen et al. | ................. 257/700 |
| 6,765,299 B2 * | 7/2004 | Takahashi et al. | ............ 257/777 |
| 6,921,980 B2 * | 7/2005 | Nakanishi et al. | ............ 257/784 |
| 7,294,922 B2 * | 11/2007 | Jobetto et al. | ............... 257/700 |
| 2001/0038151 A1 | 11/2001 | Takahashi et al. | |
| 2002/0079575 A1 | 6/2002 | Hozoji et al. | |

(Continued)

FOREIGN PATENT DOCUMENTS

JP    2000-188369    7/2000

(Continued)

*Primary Examiner*—Jasmine J Clark
(74) *Attorney, Agent, or Firm*—Rabin & Berdo, PC (57) ABSTRACT

A semiconductor device provided with a first semiconductor chip having a first functional surface formed with a first functional element and a first rear surface, a second semiconductor chip having a second functional surface which is formed with a second functional element, the second functional surface having a region opposed to the first functional surface of the first semiconductor chip and a non-opposed region defined outside the opposed region, a connection member electrically connecting the first functional element and the second functional element, an insulation film continuously covering the non-opposed region of the second semiconductor chip and the first rear surface of the first semiconductor chip, a rewiring layer provided on a surface of the insulation film, a protective resin layer covering the rewiring layer, and an external connection terminal projecting from the rewiring layer through the protective resin layer.

9 Claims, 5 Drawing Sheets

U.S. PATENT DOCUMENTS

| | | |
|---|---|---|
| 2002/0180041 A1 | 12/2002 | Sahara et al. |
| 2004/0070064 A1 | 4/2004 | Yamane et al. |
| 2004/0108579 A1 | 6/2004 | Kazama et al. |
| 2004/0219717 A1 | 11/2004 | Takahashi et al. |
| 2005/0029674 A1 | 2/2005 | Kazama et al. |

FOREIGN PATENT DOCUMENTS

| | | |
|---|---|---|
| JP | 2000-243876 | 9/2000 |
| JP | 2001-7252 | 1/2001 |
| JP | 2001-85560 | 3/2001 |
| JP | 2002--9223 | 1/2002 |
| JP | 2002-118224 | 4/2002 |
| JP | 2002-270720 | 9/2002 |
| JP | 2002-353402 | 12/2002 |
| JP | 2003-17654 | 1/2003 |
| JP | 2003-31724 | 1/2003 |
| JP | 2004-48048 | 2/2004 |

* cited by examiner

SEMICONDUCTOR DEVICE

BACKGROUND OF THE INVENTION

1. Field of the Invention

The present invention relates to a multichip module including a plurality of semiconductor chips.

2. Description of Related Art

In recent years, there has been a demand for higher density integration and size reduction of a semiconductor device. To this end, a multichip module (MCM, see Japanese Unexamined Patent Publication No. 2000-188369) and a chip scale package (CSP, see Japanese Unexamined Patent Publication No. 2002-118224) have been developed which satisfy the aforesaid demand.

Figure 8:
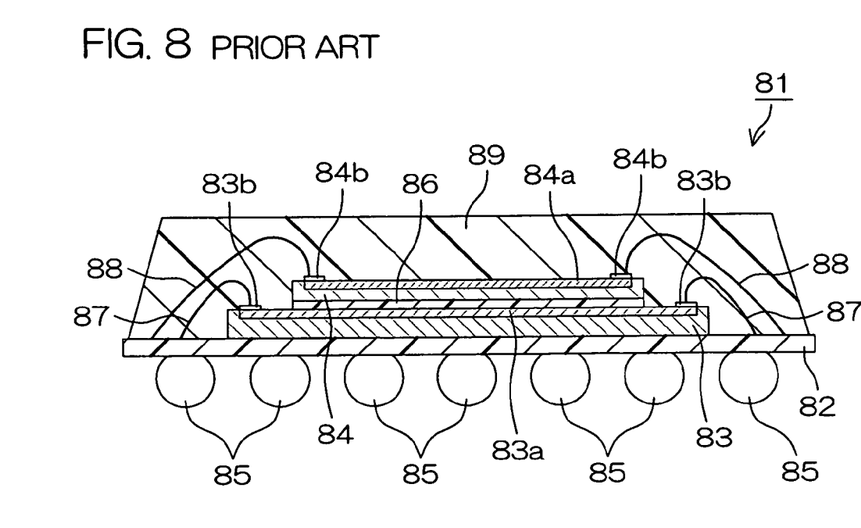
FIG. 8 is a schematic sectional view illustrating the construction of a prior art semiconductor device having a multichip module structure.

FIG. 8 is a schematic sectional view illustrating the construction of a prior art semiconductor device having a multichip module structure.

The semiconductor device 81 includes a wiring board 82, a semiconductor chip 83 disposed on the wiring board 82, and a semiconductor chip 84 disposed on the semiconductor chip 83. The semiconductor chips 83, 84 each include a functional element 83a, 84a formed in one surface thereof. The semiconductor chip 83 is bonded onto the wiring board 82 with its face up, i.e., the surface of the semiconductor chip 83 formed with the functional element 83a faces away from the wiring board 82. The semiconductor chip 84 is bonded onto the semiconductor chip 83 with its face up, i.e., the surface of the semiconductor chip 84 formed with the functional element 84a faces away from the semiconductor chip 83. An interlevel insulating material 86 is interposed between the semiconductor chips 83 and 84.

The semiconductor chip 83 is greater in size than the semiconductor chip 84 as seen perpendicularly to the surfaces formed with the functional elements 83a, 84a, so that the surface of the semiconductor chip 83 on which the semiconductor chip 84 is bonded has a peripheral area not opposed to the semiconductor chip 84. Electrode pads 83b connected to the functional element 83a are provided on the peripheral area of the semiconductor chip 83. Electrode pads 84b connected to the functional element 84a are provided on a peripheral area of the surface of the semiconductor chip 84 formed with the functional element 84a.

The wiring board 82 is greater in size than the semiconductor chip 83 as seen perpendicularly to the wiring board 82, so that the surface of the wiring board 82 on which the semiconductor chip 83 is bonded has a peripheral area not opposed to the semiconductor chip 83. Electrode pads not shown are provided on the peripheral area of the wiring board 82, and connected to the electrode pads 83b, 84b via bonding wires 87, 88, respectively.

The semiconductor chips 83, 84 and the bonding wires 87, 88 are sealed in a mold resin 89.

Metal balls 85 serving as external connection members are provided on a surface of the wiring board 82 opposite from the surface on which the semiconductor chip 83 is bonded. Electrode pads (not shown) of the wiring board 82 are rewired in and on the wiring board 82 and respectively connected to the metal balls 85.

The semiconductor device 81 is connected to a second wiring board via the metal balls 85.

Figure 9:
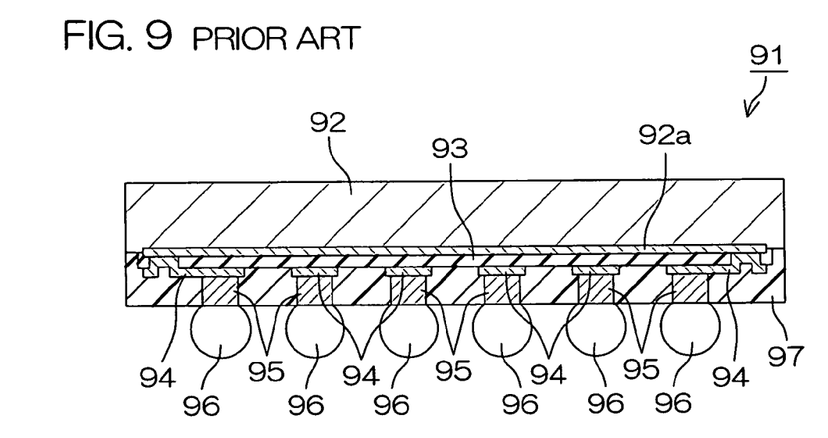
FIG. 9 is a schematic sectional view illustrating the construction of a prior art semiconductor device having a chip scale package structure.

FIG. 9 is a schematic sectional view illustrating the construction of a prior art semiconductor device having a chip scale package structure.

The semiconductor device 91 includes a semiconductor chip 92. The semiconductor chip 92 includes a functional element 92a formed in one surface thereof, and an insulation film 93 covering the functional element 92a. The insulation film 93 has openings formed in predetermined portions thereof.

Rewiring layers 94 each having a predetermined pattern are provided on the insulation film 93. The rewiring layers 94 are connected to the functional element 92a through the openings of the insulation film 93. Columnar external connection terminals 95 project from predetermined portions of the rewiring layers 94, and metal balls 96 serving as external connection members are respectively bonded onto distal ends of the external connection terminals 95.

The insulation film 93 and the rewiring layers 94 on the surface of the semiconductor chip 92 formed with the functional element 92a are covered with a protective rein layer 97. The external connection terminals 95 each extend through the protective resin layer 97. Side surfaces of the semiconductor chip 92 are flush with side surfaces of the protective resin layer 97. With the provision of the protective resin layer 97, the semiconductor device 91 has a generally rectangular prism outer shape. Therefore, the semiconductor device 91 has substantially the same size as the semiconductor chip 92 as seen perpendicularly to the semiconductor chip 92.

The semiconductor device 91 is connected to a wiring board via the metal balls 96.

In the semiconductor device 81 of FIG. 8, however, the wiring board 82 should have a greater size than the semiconductor chip 83 to provide an area for the connection with the bonding wires 87, 88. Therefore, the semiconductor device 81 (package) is greater in size than the semiconductor chips 83, 84, particularly, as measured parallel to the wiring board 82. Accordingly, the semiconductor device 81 requires a greater mounting area on the second wiring board.

Where a lead frame is used instead of the wiring board 82 (see, for example, Japanese Unexamined Patent Publication No. 2002-9223), a similar problem occurs.

On the other hand, the semiconductor device 91 of FIG. 9 includes no wiring board. With this construction, it is impossible to incorporate a plurality of chips (semiconductor chips 92) in the semiconductor device. In order to mount a plurality of semiconductor chips 92 on a wiring board, a plurality of such semiconductor devices 91 should be arranged laterally on the wiring board, requiring a greater mounting area. In addition, the semiconductor chips 92 are connected to one another via the wiring board, so that the total wiring length is increased. This makes it difficult to increase the signal processing speed of the overall system.

SUMMARY OF THE INVENTION

It is an object of the present invention to provide a semiconductor device of a multichip module structure which has substantially the same size as chips incorporated therein.

It is another object of the present invention to provide a semiconductor device of a multichip module structure which has a reduced wiring length.

A semiconductor device according to a first aspect of the present invention comprises a first semiconductor chip having a first functional surface formed with a first functional element and a first rear surface which is opposite from the first functional surface, a second semiconductor chip having a second functional surface which is formed with a second functional element, the second functional surface having a region opposed to the first functional surface of the first semiconductor chip and and a non-opposed region defined outside the opposed region, a connection member provided between the first functional surface and the second functional surface and electrically connecting the first functional element and the second functional element, an insulation film continuously covering the non-opposed region of the second semiconductor chip and the first rear surface of the first semiconductor chip, a rewiring layer provided on a surface of the insulation film and electrically connected to the second functional element, a protective resin layer covering the rewiring layer, and an external connection terminal projecting from the rewiring layer through the protective resin layer.

The inventive semiconductor device is a multichip module including the first and second semiconductor chips. According to the present invention, the first functional element of the first semiconductor chip and the second functional element of the second semiconductor chip are electrically connected to each other with the first functional surface and the second functional surface opposed to each other. Therefore, the length of a wiring between the semiconductor chips can be drastically reduced as compared with a case where a plurality of single-chip semiconductor devices are mounted on a wiring board. Thus, the inventive semiconductor device is capable of operating at a higher speed.

The connection member which electrically connects the first functional element of the first semiconductor chip and the second functional element of the second semiconductor chip may comprise, for example, bumps (projection electrodes) respectively provided on the first and second functional surfaces and bonded to each other. Alternatively, the connection member may comprise a bump provided on one of the first and second functional surfaces and bonded to the other functional surface. With the connection member, it is also possible to achieve mechanical connection between the first semiconductor chip and the second semiconductor chip.

In the semiconductor device, the first semiconductor chip may comprise a plurality of first semiconductor chips. In this case, the first semiconductor chips are each electrically connected to the second semiconductor chip with the first functional surface thereof opposed to the second functional surface. In this case, the length of wirings between the first functional elements of the first semiconductor chips and second functional elements of the second semiconductor chip and the length of wirings between the first functional elements of the first semiconductor chips via the second semiconductor chip are equivalent to the length of wirings between the second functional elements of the second semiconductor chip. Therefore, the semiconductor device is capable of operating at a higher speed.

The semiconductor device can be mounted on a wiring board via the external connection terminal. An external connection member such as a metal ball may be bonded to a distal end of the external connection terminal. In this case, the semiconductor device can be mounted on the wiring board via the external connection member.

The first semiconductor chip is preferably dimensioned and positioned so as to be substantially completely confined within the area of the second semiconductor chip as seen perpendicularly to the second functional surface. In this case, an area required for mounting the semiconductor device on the wiring board is substantially equivalent to the area of the semiconductor chip as seen perpendicular to the second functional surface. That is, the semiconductor device permits higher density integration of semiconductor chips per unit mounting area.

The insulation film is continuously provided over the non-opposed region of the second semiconductor chip and the first rear surface of the first semiconductor chip, so that the rewiring layer can be formed in any desired wiring pattern in any desired position on the surface of the insulation film. Therefore, the number of external connection terminals to be provided on the rewiring layer can be increased, as long as reduction of the size and pitch of the external connection terminals does not adversely influence the mounting accuracy.

The insulation film may also cover side surfaces of the semiconductor chips.

The surface of the insulation film provided with the rewiring layer may include a substantially flat surface extending over the non-opposed region and the first semiconductor chip.

With this arrangement, the external connection terminals each project from the rewiring layer provided on the flat surface of the insulation film. Since the semiconductor device is mounted on the wiring board with distal ends of the external connection terminals connected to the wiring board, the distal ends of the respective external connection terminals are present in substantially the same plane. Therefore, external connection terminals provided on the non-opposed region and external connection terminals provided on the first semiconductor chip in the inventive semiconductor device have substantially the same small height.

The external connection terminals may be formed, for example, by forming a protective resin layer having openings in external connection terminal formation regions and then depositing a metal material in the openings by plating. Therefore, the formation of the external connection terminals having substantially the same small height can be achieved in a shorter time. Thus, the formation of the external connection terminals of the inventive semiconductor device is facilitated.

At least a part of the rewiring layer may be electrically connected to the first rear surface of the first semiconductor chip.

With this arrangement, the first rear surface of the first semiconductor chip is maintained at a predetermined potential via the rewiring layer electrically connected to the first rear surface of the first semiconductor chip. Therefore, the potential of the first rear surface of the first semiconductor chip is stabilized. Thus, the characteristics of the first semiconductor chip can be stabilized.

The rewiring layer electrically connected to the first rear surface of the first semiconductor chip may be grounded.

The inventive semiconductor device may further comprise a heat-sink terminal projecting from the first rear surface of the first semiconductor chip through the protective resin layer.

With this arrangement, heat generated by the first semiconductor chip can be dissipated out of the semiconductor device via the heat-sink terminal through a short distance. For improvement of the heat dissipation, it is preferred to provide a plurality of heat-sink terminals.

The heat-sink terminal may be composed of, for example, the same material as the external connection terminals. In this case, the heat-sink terminal and the external connection terminals may be simultaneously formed by electrolytic plating.

An electrically conductive film may be provided between the first rear surface of the first semiconductor chip and the heat-sink terminal. In this case, the electrically conductive film and the rewiring layer may be composed of the same material. In this case, the rewiring layer and the electrically conductive film may be simultaneously formed.

The inventive semiconductor device may further comprise a diffusion prevention film of an electrically conductive material provided between the first rear surface of the first semiconductor chip and the insulation film and between the first rear surface and the heat-sink terminal.

With this arrangement, the diffusion prevention film is provided between the first rear surface of the first semiconductor chip and the insulation film, i.e., below the insulation film. In a production process for the semiconductor device, the diffusion prevention film is first formed on the first rear surface of the first semiconductor chip, and the insulation film is formed as having an opening at a predetermined position on the diffusion prevention film. Then, the heat-sink terminal is formed so as to be connected to the first rear surface of the first semiconductor chip through the opening.

Where the insulation film is formed on the first rear surface of the first semiconductor chip without the formation of the diffusion prevention film and then the diffusion prevention film is formed on a portion of the first rear surface of the first semiconductor chip exposed in the opening of the insulation film, it may be impossible to completely cover the exposed portion of the first rear surface of the first semiconductor chip with the diffusion prevention film thus formed. In this case, the diffusion prevention film is liable to have holes in the vicinity of the interior surface of the opening of the insulation film and, if the metal heat-sink terminal is formed on the diffusion prevention film, metal atoms of the heat-sink terminal will diffuse into the first semiconductor chip through the holes of the diffusion prevention film. In this case, the characteristics of the first semiconductor chip will vary.

In the production process for the inventive semiconductor device, on the contrary, the diffusion prevention film can be formed on the first rear surface (preferably on the entire first rear surface) of the first semiconductor chip before the formation of the insulation film. Therefore, the diffusion prevention film thus formed is free from the holes, so that the first rear surface of the first semiconductor chip can be completely covered with the diffusion prevention film. Thus, the diffusion of the metal atoms of the heat-sink terminal into the first semiconductor chip and hence the variation in the characteristics of the first semiconductor chip can be suppressed.

The diffusion prevention film may be composed of, for example, a known UBM (under-bump metal) material or the like.

An electrically conductive film composed of the same material as the rewiring layer may be provided between the diffusion prevention film provided on the first rear surface of the first semiconductor chip and the heat-sink terminal. In this case, the provision of the diffusion prevention film suppresses (prevents) the diffusion of atoms (metal atoms) of the electrically conductive film into the first semiconductor chip.

The inventive semiconductor device may further comprise a diffusion prevention film of an electrically conductive material provided between the first rear surface of the first semiconductor chip and the insulation film and between the first rear surface and the rewiring layer.

With this arrangement, the diffusion prevention film is provided between the first rear surface of the first semiconductor chip and the insulation film, i.e., below the insulation film. In the production process for the semiconductor device, the diffusion prevention film is formed on the first rear surface of the first semiconductor chip, and the insulation film is formed as having an opening at a predetermined position on the diffusion prevention film. Then, the rewiring layer is formed so as to be connected to the first rear surface of the first semiconductor chip through the opening.

Since the formation of the diffusion prevention film precedes the formation of the insulation film, the diffusion prevention film is free from holes. Therefore, the first rear surface of the first semiconductor chip can be completely covered with the diffusion prevention film. Thus, the diffusion of atoms (metal atoms) of the rewiring layer and hence the variation in the characteristics of the first semiconductor chip can be suppressed.

The diffusion prevention film may be composed of, for example, a known UBM material or the like.

The inventive semiconductor device may further comprise a rear surface protective film provided on a second rear surface of the second semiconductor chip which is opposite from the second functional surface.

With this arrangement, the second rear surface of the second semiconductor chip can be protected mechanically and electrically by the rear surface protective film.

Where the rear surface protective film is not provided, the second semiconductor chip is liable to be warped due to stress imbalance occurring along the thickness of the second semiconductor chip by the provision of the insulation film and the protective resin layer on one of the surfaces (functional surface) of the second semiconductor chip. In the inventive semiconductor device, however, the rear surface protective film is provided on the other surface (rear surface) of the second semiconductor chip, so that stresses exerted on the second semiconductor chip can be properly balanced along the thickness of the second semiconductor chip. Thus, the warp of the second semiconductor chip can be mitigated (prevented).

The rear surface protective film may be composed of, for example, a resin.

The inventive semiconductor device may further comprise a via-conductor projecting from the non-opposed region of the second semiconductor chip through the insulation film and electrically connecting the second functional element and the rewiring layer.

With this arrangement, the via-conductor can be formed as projecting from the non-opposed region of the second semiconductor chip prior to the formation of the insulation film when the semiconductor device is produced. Thereafter, the insulation film is formed so that the via-conductor extends through the insulation film. Then, the rewiring layer is formed so as to be electrically connected to the via-conductor.

Where no via-conductor is to be provided, it is necessary to form the insulation film and then form an opening in the insulation film for the provision of the rewiring layer. According to the present invention, on the contrary, the opening formation step can be obviated.

A semiconductor device according to a second aspect of the present invention comprises a semiconductor chip having a functional element formed in one surface thereof, an insulation film covering a rear surface of the semiconductor chip which is opposite from the surface formed with the functional element, an electrically conductive member electrically connected to the rear surface of the semiconductor chip through an opening formed in the insulation film, and a diffusion prevention film provided between the rear surface of the semiconductor chip and the insulation film and between the rear surface and the electrically conductive member.

According to the present invention, the rear surface of the semiconductor chip can be maintained at a predetermined potential via the electrically conductive member. Thus, the potential of the rear surface of the semiconductor chip can be stabilized, thereby stabilizing the characteristics of the semiconductor chip. The electrically conductive member may be, for example, grounded.

The diffusion prevention film is provided between the rear surface of the semiconductor chip and the insulation film, i.e., below the insulation film. In a production process for the semiconductor device, the insulation film is first formed as having an opening at a predetermined position on the diffusion prevention film formed on the rear surface of the semiconductor chip, and then the electrically conductive member is formed so as to be electrically connected to the rear surface of the semiconductor chip through the opening.

Since the formation of the diffusion prevention film precedes the formation of the insulation film, the rear surface of the semiconductor chip can be completely covered with the diffusion prevention film thus formed. The provision of the diffusion prevention film suppresses the diffusion of atoms (metal atoms) of the electrically conductive material into the semiconductor chip and hence the variation in the characteristics of the semiconductor chip.

The semiconductor device which includes the semiconductor chip having the functional element provided on one surface thereof can be produced by a semiconductor device production process which comprises the steps of: forming a diffusion prevention film of an electrically conductive material on a rear surface (preferably on the entire rear surface) of the semiconductor chip which is opposite from the surface formed with the functional element; forming an insulation film on the diffusion prevention film, the insulation film having an opening through which a part of the diffusion prevention film is exposed; and forming an electrically conductive member electrically connected to the rear surface of the semiconductor chip through the opening of the insulation film.

The foregoing and other objects, features and effects of the present invention will become more apparent from the following description of the preferred embodiments with reference to the attached drawings.

DESCRIPTION OF THE PREFERRED EMBODIMENTS

Figure 1:
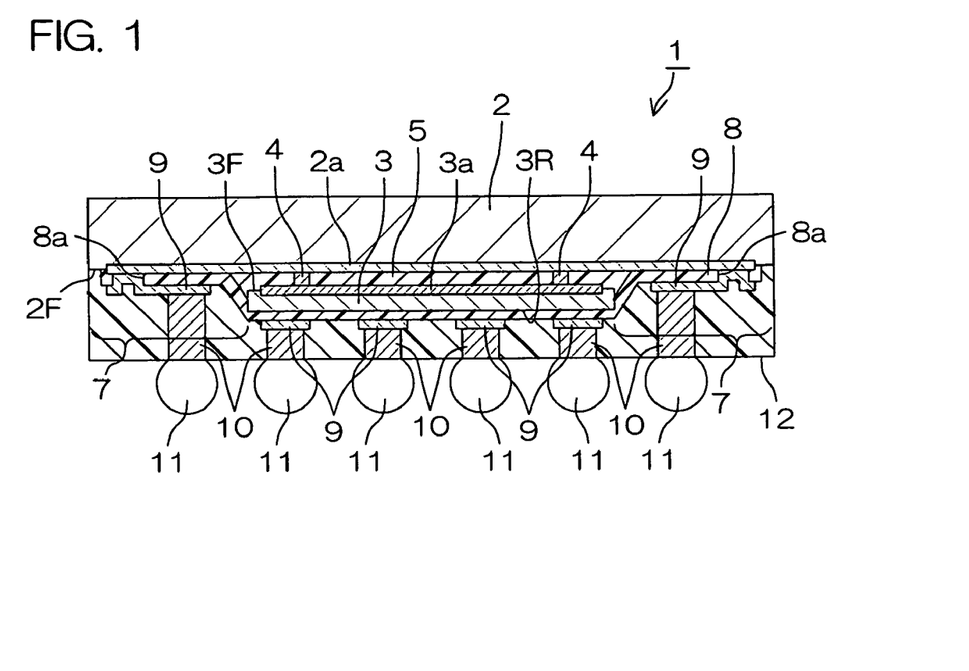
FIG. 1 is a schematic sectional view illustrating the construction of a semiconductor device according to a first embodiment of the present invention.

FIG. 1 is a schematic sectional view illustrating the construction of a semiconductor device according to a first embodiment of the present invention.

The semiconductor device 1 is a so-called chip scale package (CSP) of a multichip module type which includes first and second semiconductor chips 2, 3.

The first semiconductor chip 3 has a first functional surface 3F formed with a first functional element 3a and a rear surface 3R opposite from the first functional surface 3F. Further, the second semiconductor chip 2 has a second functional surface 2F formed with a second functional element 2a. For example, the first functional element 3a and the second functional element 2a may each be a transistor. The first semiconductor chip 3 and the second semiconductor chip 2 are disposed in spaced parallel relation with the first functional surface 3F and the second functional surface 2F opposed to each other.

The first functional element 3a and the second functional element 2a are electrically connected to each other via connection members 4 disposed between the first semiconductor chip 3 (first functional surface 3F) and the second semiconductor chip 2 (second functional surface 2F). The connection members 4 may each be such that a bump (projection electrode) provided at a predetermine position on the first functional surface 3F and a bump provided at a predetermined position on the second functional surface 2F are connected to each other. Alternatively, the connection members 4 may each be such that a bump provided on one of the first and second functional surfaces 3F, 2F is connected to the other functional surface 2F, 3F. Mechanical connection between the first semiconductor chip 3 and the second semiconductor chip 2 is also achieved by the connection members 4.

An interlevel seal (under-fill) layer 5 is provided as filling a space between the first semiconductor chip 3 and the second semiconductor chip 2.

The first semiconductor chip 3 is smaller in size than the second semiconductor chip 2 as seen perpendicularly to the second functional surface 2F, and is completely confined within the area of the second semiconductor chip 2. The first semiconductor chip 3 is disposed generally centrally of the second functional surface 2F of the second semiconductor chip 2. Therefore, the second functional surface 2F has a peripheral area (hereinafter referred to as "non-opposed region") 7 which is not opposed to the first semiconductor chip 3.

The second functional element 2a is provided over the non-opposed region 7 and an opposed region of the second functional surface 2F to which the first semiconductor chip 3 is opposed.

An insulation film 8 is continuously provided as covering a part of the non-opposed region 7 formed with the second functional element 2a, side surfaces of the interlevel seal layer 5 and the rear surface 3R and side surfaces of the first semiconductor chip 3. The insulation film 8 is composed of, for example, a polyimide, a polybenzoxazole, an epoxy, silicon oxide or silicon nitride. The insulation film 8 has a generally uniform thickness.

Rewiring layers 9 each having a predetermined pattern are provided on the insulation film 8. The rewiring layers 9 are present on the insulation film 8 on the non-opposed region 7 and the first semiconductor chip 3.

The insulation film 8 has openings 8a provided therein on the non-opposed region 7, and electrode pads (not shown) provided on predetermined areas of the second functional element 2a are exposed in the openings 8a. The rewiring layers 9 are electrically connected to the electrode pads on the second functional element 2a through the openings 8a of the insulation film 8.

The electrode pads on the second functional element 2a and the rewiring layers 9 may be composed of different materials. For example, the electrode pads may be composed of aluminum (Al), and the rewiring layers 9 may be composed of copper (Cu). In this case, UBM (under-bump metal) layers (not shown) are preferably provided between the electrode pads on the second functional element 2a and the rewiring layers 9. Alternatively, the electrode pads on the second functional element 2a and the rewiring layers 9 may be composed of the same material.

A protective resin layer 12 is provided on the side of the second functional surface 2F of the second semiconductor chip 2 as covering the insulation film 8 and the rewiring layers 9. Side surfaces of the second semiconductor chip 2 are flush with side surfaces of the protective resin layer 12. With the provision of the protective rein layer 12, the semiconductor device 1 has a generally rectangular prism outer shape.

External connection metal terminals 10 project from predetermined positions of the rewiring layers 9 provided on the non-opposed region 7 and the rewiring layers 9 provided on the first semiconductor chip 3 through the protective resin layer 12. The external connection terminals 10 are composed of a metal (e.g., copper, nickel (Ni), gold (Au) or tungsten (W)), and each have a columnar outer shape (e.g., a cylindrical shape or a rectangular prism shape).

Distal ends of the external connection terminals 10 are present in substantially the same plane. Connection interfaces between the external connection terminals 10 and metal balls 11 are present in substantially the same plane as a surface of the protective resin layer 12. That is, the external connection terminals 10 projecting from the rewiring layers 9 on the non-opposed region 7 each have a greater height than the external connection terminals 10 projecting from the rewiring layers 9 on the first semiconductor chip 3.

The metal balls 11 serving as external connection members are respectively bonded onto the distal ends of the external connection terminals 10. The semiconductor device 1 can be mounted on a wiring board via the metal balls 11.

As described above, the semiconductor device 1 has substantially the same size as the second semiconductor chip 2 (which is the largest chip in the semiconductor device 1) as seen perpendicularly to the second functional surface 2F, so that the semiconductor device 1 requires a smaller mounting area on the wiring board. That is, the semiconductor device 1 permits higher density integration of first and second semiconductor chips 3, 2 per unit mounting area.

The first functional element 3a and the second functional element 2a are connected in face-to-face relation with the first and second functional surfaces 3F, 2F opposed to each other. Therefore, the length of wirings between the first functional element 3a and the second functional element 2a of the respective chips (first and second semiconductor chips 3, 2) in the semiconductor device 1 is reduced as compared with a case where a plurality of prior art semiconductor devices 91 (see FIG. 9) are mounted on the wiring board or a prior art semiconductor device 81 (see FIG. 8) is mounted on the wiring board. Thus, the semiconductor device 1 is capable of operating at a higher speed.

The rewiring layers 9 may each be formed in any desired wiring pattern in any desired position on the surface of the insulation film 8. Therefore, the number of the external connection terminals 10 provided on the rewiring layers 9 can be increased, as long as reduction of the size and pitch of the external connection terminals 10 does not adversely influence the mounting accuracy.

The semiconductor device 1 can be produced, for example, on a wafer basis. More specifically, the production of the semiconductor device 1 can be achieved by preparing a large substrate (e.g., a semiconductor wafer) having a plurality of second semiconductor chip regions densely arranged therein, simultaneously connecting first semiconductor chips 3 to the respective second semiconductor chip regions of the substrate, filling an interlevel sealing agent 5 in spaces between the second semiconductor chip regions of the substrate and the first semiconductor chips 3, forming an insulation film 8, forming rewiring layers 9, forming a protective resin layer 12, forming external connection terminals 10, bonding metal balls 11 to the respective external connection terminals 10, and dicing the substrate together with the protective resin layer 12 along boundaries between the second semiconductor chip regions into a plurality of semiconductor devices 1.

The formation of the insulation film 8 may be achieved, for example, by applying a low viscosity resin on non-opposed regions 7 of the substrate (second semiconductor chip regions) and side surfaces and rear surfaces 3R of the first semiconductor chips 3 by spin coating after connecting the first semiconductor chips 3 to the substrate and filling the spaces with the interlevel sealing agent 5, and then curing the resin. The insulation film 8 may be formed from a photosensitive resin. In this case, the insulation film 8 is formed as having a predetermined pattern with openings 8a by applying a liquid photosensitive resin over a surface of the substrate connected to the first semiconductor chips 3 with the interlevel sealing agent 5 filled in the spaces between the substrate and the first semiconductor chips 3, and exposing and developing the photosensitive resin.

The formation of the external connection terminals 10 may be achieved, for example, by forming the protective resin layer 12 over a surface of the substrate formed with the insulation film 8, forming openings in external connection terminal formation regions of the protective resin layer 12, forming a seed layer over a surface of the substrate formed with the protective resin layer 12 (including interior surfaces of the openings), and then depositing a metal material on the seed layer to fill the openings with the metal material by electrolytic plating.

Figure 2:
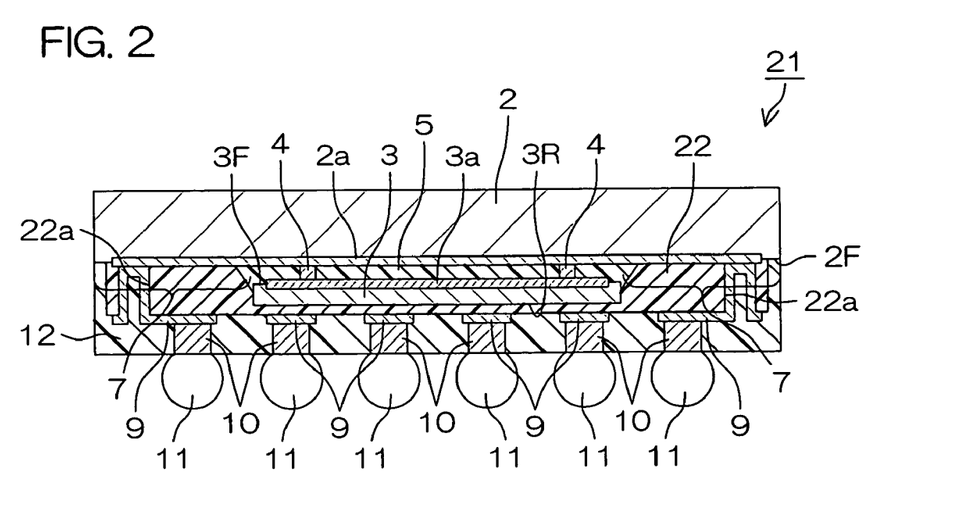
FIG. 2 is a schematic sectional view illustrating the construction of a semiconductor device according to a second embodiment of the present invention.

FIG. 2 is a schematic sectional view illustrating the construction of a semiconductor device according to a second embodiment of the present invention. In FIG. 2, components corresponding to those shown in FIG. 1 are denoted by the same reference characters as in FIG. 1, and no explanation will be given thereto.

The semiconductor device 21 includes an insulation film 22 instead of the insulation film 8 shown in FIG. 1. The insulation film 22 is provided over the non-opposed region 7 and the first semiconductor chip 3, and has a greater thickness on the non-opposed region 7 than on the first-semiconductor chip 3. Thus, the surface of the insulation film 22 formed with the rewiring layers 9 is substantially flat over the non-opposed region 7 and the first semiconductor chip 3. Therefore, the external connection terminals 10 have substantially the same height.

The rewiring layers 9 are connected to the electrode pads on the second functional element 2a through openings 22a formed in the insulation film 22. The rewiring layers 9 partly extend along interior surfaces of the openings 22a, and the insides of the openings 22a are filled with the protective resin layer 12.

Where the external connection terminals 10 are formed as having a smaller height, the protective resin layer 12 has shallow openings in the external connection terminal formation regions thereof. Therefore, the deposition of the metal material in the openings requires a shorter period of time for the formation of the external connection terminals 10.

Since the external connection terminals 10 to be formed have substantially the same height, the openings formed in the protective resin layer 12 are filled up with the metal material at substantially the same time, for example, by the plating described above. Therefore, the plating can be terminated without over-deposition of the metal material in the openings. This obviates the need for removing a part of the metal material deposited over the openings on the protective resin layer 12 or reduces the time required for the removal of the over-deposited metal material. Thus, the external connection terminals 10 of the semiconductor device 21 can be easily formed.

Figure 3:
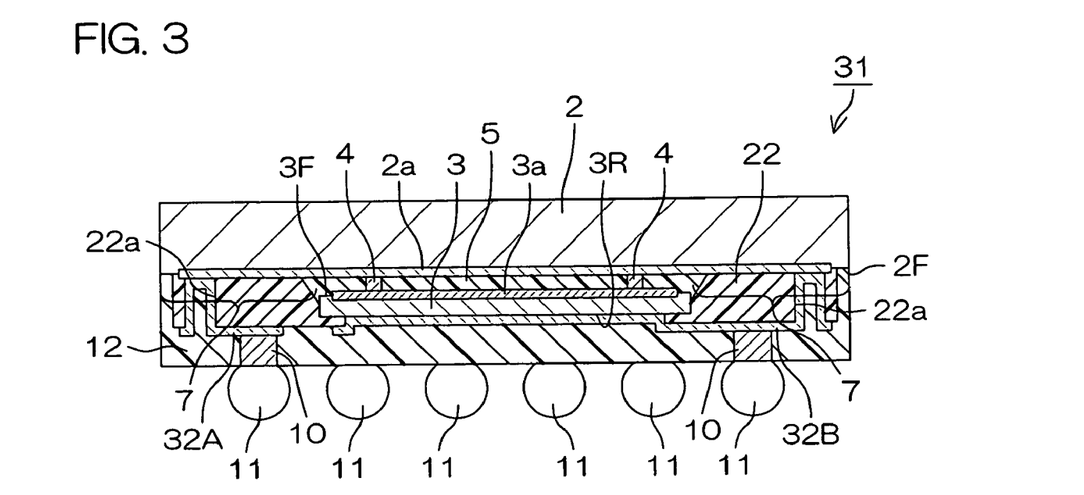
FIG. 3 is a schematic sectional view illustrating the construction of a semiconductor device according to a third embodiment of the present invention.

FIG. 3 is a schematic sectional view illustrating the construction of a semiconductor device according to a third embodiment of the present invention. In FIG. 3, components corresponding to those shown in FIGS. 1 and 2 are denoted by the same reference characters as in FIGS. 1 and 2, and no explanation will be given thereto.

The semiconductor device 31 includes a rewiring layer 32A connected to the second functional element 2a through an opening 22a formed in the insulation film 22 and a rewiring layer 32B connected to the second functional element 2a through another opening 22a formed in the insulation film 22 and to the rear surface 3R of the first semiconductor chip 3.

A center portion of the rear surface 3R of the first semiconductor chip 3 is not covered with the insulation film 8, but covered with the rewiring layer 32B.

Some of the metal balls 11 are connected to the rewiring layer 32A or the rewiring layer 32B via external connection terminals 10 not shown in the section in FIG. 3.

With the aforesaid arrangement, some of the external connection terminals 10 are electrically connected to the rear surface 3R of the first semiconductor chip 3 via the rewiring layer 32B. The rear surface 3R of the first semiconductor chip 3 can be maintained at a predetermined potential via the external connection terminals 10. Thus, the potential of the rear surface 3R of the first semiconductor chip 3 can be fixed, thereby stabilizing the operation characteristics of the first semiconductor chip 3.

The external connection terminals 10 electrically connected to the rear surface 3R of the first semiconductor chip 3 via the rewiring layer 32B may serve as grounding terminals. In this case, the rear surface 3R of the first semiconductor chip 3 can be grounded with its potential being fixed.

Figure 4:
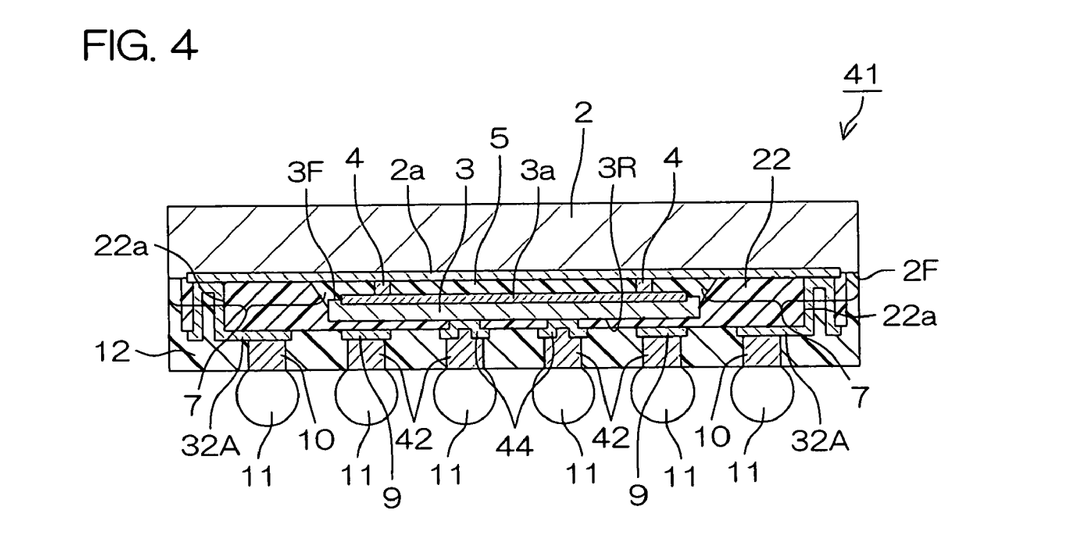
FIG. 4 is a schematic sectional view illustrating the construction of a semiconductor device according to a fourth embodiment of the present invention.

FIG. 4 is a schematic sectional view illustrating the construction of a semiconductor device according to a fourth embodiment of the present invention. In FIG. 4, components corresponding to those shown in FIGS. 1 to 3 are denoted by the same reference characters as in FIGS. 1 to 3, and no explanation will be given thereto.

In the semiconductor device 41, the rear surface 3R of the first semiconductor chip 3 is mostly covered with the insulation film 22. A portion of the insulation film 22 covering the first semiconductor chip 3 has openings each having a slightly smaller width than the external connection terminals 10. External connection terminals (hereinafter referred to as "heat-sink terminals") 42 for dissipating heat and fixing the potential of the rear surface 3R of the first semiconductor chip 3 are connected to the rear surface 3R of the first semiconductor chip 3 through the openings. The heat-sink terminals 42 each have the same size and shape as the external connection terminals 10. The heat-sink terminals 42 are composed of the same material (metal) as the external connection terminals 10. Metal balls 11 are respectively bonded to distal ends of the heat-sink terminals 42.

Electrically conductive films 44 composed of the same material as rewiring layers 32A and each having substantially the same thickness as the rewiring layers 32A are provided between the rear surface 3R of the first semiconductor chip 3 and the heat-sink terminals 42.

The heat-sink terminals 42 may serve as, for example, grounding terminals. By grounding the rear surface 3R of the first semiconductor chip 3 via the heat-sink terminals 42, the potential of the rear surface 3R of the first semiconductor chip 3 is fixed and, hence, the operation characteristics of the first semiconductor chip 3 are stabilized.

In the semiconductor device 31 according to the third embodiment (see FIG. 3), the rewiring layer 32B connected to the rear surface 3R of the first semiconductor chip 3 extend over the non-opposed region 7, and the external connection terminal 10 is bonded to the extension (the portion on the non-opposed region 7) of the rewiring layer 32B. In the semiconductor device 41 according to the fourth embodiment, on the contrary, the heat-sink terminals 42 are provided in adjacent relation on the rear surface 3R of the first semiconductor chip 3 with the intervention of the electrically conductive films 44. Therefore, heat generated by the first semiconductor chip 3 in the semiconductor device 41 can be efficiently dissipated out of the semiconductor device 41 via the heat-sink terminals 42 through a shorter distance.

A single heat-sink terminal 42 and an associated metal ball 11 may be connected to the rear surface 3R of the first semiconductor chip 3. Even in this case, it is possible to fix the potential of the rear surface 3R of the first semiconductor chip 3 (by grounding the rear surface 3R of the first semiconductor chip 3) and to dissipate the heat generated by the first semiconductor chip 3. However, where the plurality of heat-sink terminals 42 and the associated metal balls 11 are provided on the rear surface 3R of the first semiconductor chip 3 as shown in FIG. 4, the heat generated by the first semiconductor chip 3 can be more efficiently dissipated.

Figure 5:
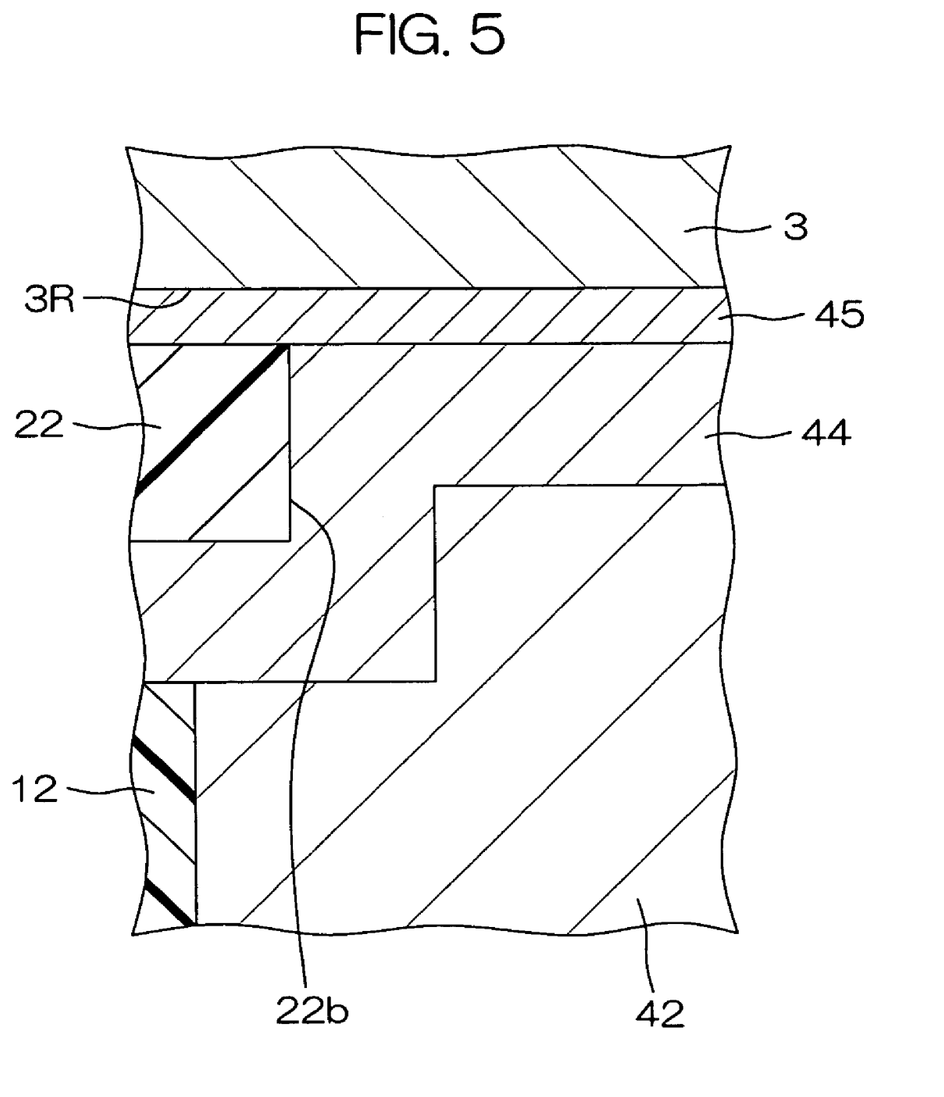
FIG. 5 is a schematic sectional view illustrating, on an enlarged scale, a junction between a rear surface of a first semiconductor chip and a heat-sink terminal in the semiconductor device shown in FIG. 4.

FIG. 5 is a schematic sectional view illustrating, on an enlarged scale, a junction between the rear surface 3R of the first semiconductor chip 3 and the heat-sink terminal 42.

A diffusion prevention film 45 of an electrically conductive material is provided over the rear surface 3R of the first semiconductor chip 3. The diffusion prevention film 45 is disposed between the rear surface 3R of the first semiconductor chip 3 and the insulation film 22 and between the rear surface 3R of the first semiconductor chip 3 and the heat-sink terminals 42 (electrically conductive films 44). The diffusion prevention film 45 may also cover side surfaces of the first semiconductor chip 3.

The diffusion prevention film 45 is composed of a material which can prevent (suppress) diffusion of metal atoms of the heat-sink terminals 42 and the electrically conductive films 44 into the first semiconductor chip 3, for example, a known UBM (under-bump metal) material such as titanium (Ti), titanium tungsten (TiW), nickel, titanium nitride (TiN) or tantalum nitride (TaN)).

For production of the semiconductor device 41, first semiconductor chips 3 are connected to a substrate having a plurality of second semiconductor chip regions densely arranged therein in the same manner as for the production of the semiconductor device 1 of the first embodiment. Then, a diffusion prevention film 45 is formed over a surface of the substrate to which the first semiconductor chips 3 are connected, and a portion of the diffusion prevention film 45 present outside rear surfaces 3R (and side surfaces) of the first semiconductor chips 3 is removed.

Thereafter, an insulation film 22 is formed as having predetermined openings 22b (see FIG. 5) on the resulting substrate, and an electrically conductive film 44 is formed in a predetermined pattern over the insulation film 22 and portions of the rear surfaces 3R of the first semiconductor chips 3 (diffusion prevention film 45) exposed in the openings 22b. Thus, semiconductor devices 41 each having a construction shown in FIGS. 4 and 5 are produced.

If the diffusion prevention film 45 is formed not before the formation of the insulation film 22 but after the formation of the insulation film 22, portions of the rear surface 3R of the first semiconductor chip 3 adjacent to the interior surfaces of the openings 22b formed in the insulation film 22 cannot be completely covered with the diffusion prevention film 45, and the diffusion prevention film 45 is liable to have holes.

Before the formation of the insulation film 22, on the other hand, the rear surface 3R of the first semiconductor chip 3 is flat, so that the diffusion prevention film 45 can be formed on the rear surface 3R as completely covering the rear surface 3R without formation of the holes. Thus, the diffusion prevention film 45 can prevent (suppress) the diffusion of the metal atoms of the heat-sink terminals 42 and the electrically conductive film 44 into the first semiconductor chip 3.

Figure 6:
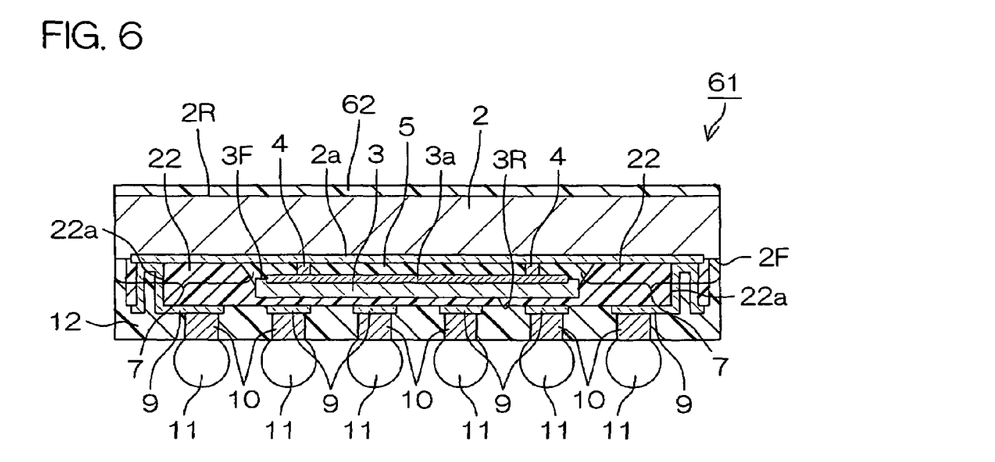
FIG. 6 is a schematic sectional view illustrating the construction of a semiconductor device according to a fifth embodiment of the present invention.

FIG. 6 is a schematic sectional view illustrating the construction of a semiconductor device according to a fifth embodiment of the present invention. In FIG. 6, components corresponding to those shown in FIGS. 1 to 4 are denoted by the same reference characters as in FIGS. 1 to 4, and no explanation will be given thereto.

In the semiconductor device 61, a rear surface protective film 62 is provided on the rear surface 2R of the second semiconductor chip 2 opposite from the second functional surface 2F. The rear surface protective film 62 mechanically and electrically protects the rear surface 2R of the second semiconductor chip 2.

Where the rear surface protective film 62 is not provided as in the semiconductor device 21 of the second embodiment (see FIG. 2), the provision of the insulation film 22 and the protective resin layer 12 on one surface (second functional surface 2F) of the second semiconductor chip 2 causes stress imbalance along the thickness of the second semiconductor chip 2, resulting in warp of the second semiconductor chip 2. In the semiconductor device 61, on the contrary, the rear surface protective film 62 is provided on the other surface (rear surface 2R) of the second semiconductor chip 2, whereby stresses exerted on the second semiconductor chip 2 are balanced along the thickness of the second semiconductor chip 2. Therefore, the warp of the second semiconductor chip 2 can be mitigated (prevented).

The rear surface protective film 62 may be composed of a resin such as a polyimide, a polyamide or an epoxy.

Figure 7:
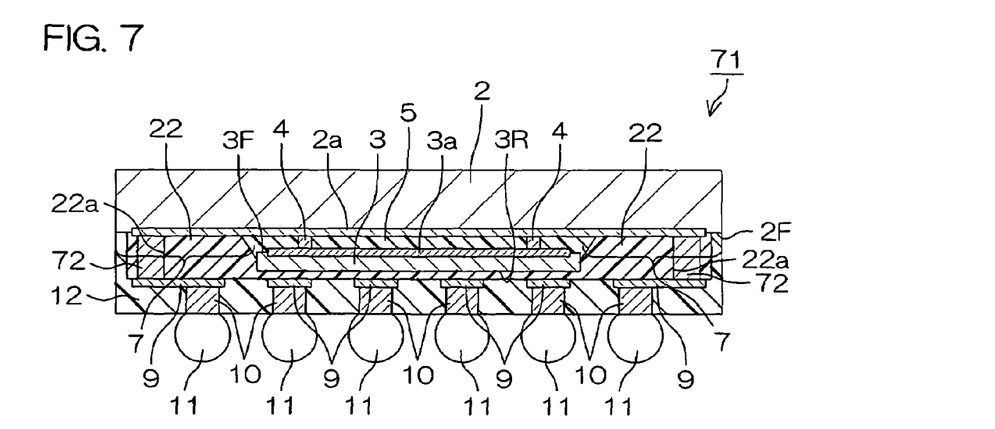
FIG. 7 is a schematic sectional view illustrating the construction of a semiconductor device according to a sixth embodiment of the present invention.

FIG. 7 is a schematic sectional view illustrating the construction of a semiconductor device according to a sixth embodiment of the present invention. In FIG. 7, components corresponding to those shown in FIGS. 1 to 4 are denoted by the same reference characters as in FIGS. 1 to 4, and no explanation will be given thereto.

Via-conductors 72 are provided in the openings 22a formed in the insulation film 22 in the semiconductor device 71. The openings 22a are filled with the via-conductors 72. The second functional element 2a of the second semiconductor chip 2 is electrically connected to the rewiring layers 9 via the via-conductors 72.

When the semiconductor device 71 is produced, for example, the via-conductors 72 are formed as projecting from the second functional surface 2F of the second semiconductor chip 2 before the formation of the insulation film 22. Thereafter, the insulation film 22 is formed so that the via-conductors 72 extend through the insulation film 22. Then, the rewiring layers 9 are formed so as to be electrically connected to the via-conductors 72.

Where a semiconductor device having no via-conductor 72, e.g., the semiconductor device 21 of the second embodiment (see FIG. 2), is produced, the insulation film 22 should first be formed and then patterned to be formed with the openings for the provision of the rewiring layers 9 on the insulation film 22. In the production of the semiconductor device 71, on the contrary, the opening formation step can be obviated.

Different materials may be selected for the via-conductors 72 and the rewiring layers 9.

While the embodiments of the present invention have thus been described, the present invention may be embodied in any other ways. For example, the inventive semiconductor device may include a plurality of first semiconductor chips 3. In this case, the first semiconductor chips 3 are electrically connected to a second semiconductor chip 2 with first functional surfaces 3F thereof opposed to a second functional surface 2F of the second semiconductor chip 2. In this case, the length of wirings between the first functional elements 3a of the first semiconductor chips 3 and the second functional elements 2a of the second semiconductor chip 2 and the length of wirings between the first functional elements 3a of the first semiconductor chips 3 are equivalent to the length of wirings between the second functional elements 2a of the second semiconductor chip 2. Therefore, the semiconductor device is capable of operating at a higher speed.

In the semiconductor device 31 of the third embodiment (see FIG. 3), the same diffusion prevention film as the diffusion prevention film 45 of the semiconductor device 41 of the fourth embodiment (see FIG. 5) may be provided between the rear surface 3R of the first semiconductor chip 3 and the insulation film 22 and between the rear surface 3R and the rewiring layer 32B. In this case, diffusion of metal atoms of the rewiring layer 32B into the first semiconductor chip 3 can be prevented (suppressed).

In the semiconductor device 1 of the first embodiment, the rewiring layers 9 are partly disposed in the openings 8a. Alternatively, via-conductors each having a smaller height than the via-conductors 72 (see FIG. 7) (a height equivalent to the thickness of the insulation film 8 on the non-opposed region 7) may be provided (filled) in the respective openings 8a. In this case, the formation of the via-conductors may be achieved simultaneously with the formation of the connection members 4 or the bumps for the connection members 4.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2004-178756 filed with the Japanese Patent Office on Jun. 16, 2004, the disclosure of which is incorporated herein by reference.

What is claimed is:

1. A semiconductor device comprising:
  a first semiconductor chip having a first functional surface formed with a first functional element and a first rear surface which is opposite from the first functional surface;
  a second semiconductor chip having a second functional surface which is formed with a second functional element, the second functional surface having a region opposed to the first functional surface of the first semiconductor chip and and a non-opposed region defined outside the opposed region;
  a connection member provided between the first functional surface and the second functional surface and electrically connecting the first functional element and the second functional element;

an insulation film continuously covering the non-opposed region of the second semiconductor chip and the first rear surface of the first semiconductor chip;

a rewiring layer provided on a surface of the insulation film and electrically connected to the second functional element;

a protective resin layer covering the rewiring layer; and an external connection terminal projecting from the rewiring layer through the protective resin layer.

2. A semiconductor device as set forth in claim 1, wherein the surface of the insulation film provided with the rewiring layer includes a substantially flat surface extending over the non-opposed region and the first semiconductor chip.

3. A semiconductor device as set forth in claim 1, wherein at least a part of the rewiring layer is electrically connected to the first rear surface of the first semiconductor chip.

4. A semiconductor device as set forth in claim 1, further comprising a heat-sink terminal projecting from the first rear surface of the first semiconductor chip through the protective resin layer.

5. A semiconductor device as set forth in claim 4, further comprising a diffusion prevention film of an electrically conductive material provided between the first rear surface of the first semiconductor chip and the insulation film and between the first rear surface and the heat-sink terminal.

6. A semiconductor device as set forth in claim 1, further comprising a diffusion prevention film of an electrically conductive material provided between the first rear surface of the first semiconductor chip and the insulation film and between the first rear surface and the rewiring layer.

7. A semiconductor device as set forth in claim 1, further comprising a rear surface protective film provided on a second rear surface of the second semiconductor chip which is opposite from the second functional surface.

8. A semiconductor device as set forth in claim 1, further comprising a via-conductor projecting from the non-opposed region of the second semiconductor chip through the insulation film and electrically connecting the second functional element and the rewiring layer.

9. A semiconductor device comprising:

a semiconductor chip having a functional element formed in one surface thereof;

an insulation film covering a rear surface of the semiconductor chip which is opposite from the surface formed with the functional element;

an electrically conductive member electrically connected to the rear surface of the semiconductor chip through an opening formed in the insulation film; and a diffusion prevention film provided between the rear surface of the semiconductor chip and the insulation film and between the rear surface and the electrically conductive member.

* * * * *